United States Patent [19]
Mayer

[11] 3,894,291
[45] July 8, 1975

[54] PRECISION TWO-PHASE ELECTRON OSCILLATOR EMPLOYING AN ALL-PASS NETWORK HAVING MEANS FOR ADJUSTING ITS TIME CONSTANT AS A FUNCTION OF THE AMPLITUDE OF THE OSCILLATING VOLTAGE

[75] Inventor: Arthur Mayer, Kew Gardens, N.Y.

[73] Assignee: Astrosystems, Inc., Lake Success, N.Y.

[22] Filed: Feb. 15, 1973

[21] Appl. No.: 332,759

[52] U.S. Cl................. 331/45; 331/135; 331/177 R; 331/183

[51] Int. Cl.².. H03B 3/02; H03B 5/20; H03B 27/00

[58] Field of Search........... 331/45, 135, 177 R, 183

[56] References Cited

UNITED STATES PATENTS

| | | | |
|---|---|---|---|
| 3,482,188 | 12/1969 | Crouse | 331/135 |
| 3,639,859 | 2/1972 | Zwlisen | 331/135 X |
| 3,656,066 | 4/1972 | Reynal | 331/135 X |

*Primary Examiner*—H. K. Saalbach
*Assistant Examiner*—S. Grimm
*Attorney, Agent, or Firm*—Stevens, Davis, Miller & Mosher

[57] ABSTRACT

A two-phase electronic oscillator comprises an integrator coupled in a loop with an all-pass network. The input resistor of the integrator is an incandescent lamp filament having a positive temperature coefficient of resistance, which adjusts the time constant of the integrator as a function of the amplitude of the oscillator voltages, thereby enforcing the condition for oscillation. The input and output voltages of the integrator are precisely in quadrature, and have precisely the same amplitude.

4 Claims, 6 Drawing Figures

PRECISION TWO-PHASE ELECTRON OSCILLATOR EMPLOYING AN ALL-PASS NETWORK HAVING MEANS FOR ADJUSTING ITS TIME CONSTANT AS A FUNCTION OF THE AMPLITUDE OF THE OSCILLATING VOLTAGE

BACKGROUND OF THE INVENTION

This invention relates to a two-phase electronic oscillator and, in particular, to an oscillator for generating two sinusoidal voltages in the audio frequency range which are precisely in phase quadrature, precisely matched in amplitude and which have essentially no harmonic distortion.

A two-phase voltage can be generated by coupling first and second integrators and an inverting amplifier in a closed loop. In such a connection, the output of the first integrator is coupled to the input of the second integrator, the output of the second integrator is coupled to the input of the inverting amplifier and the output of the inverting amplifier is coupled to the input of the first integrator. The voltages at the outputs of the first integrator and the inverting amplifier are 90° out of phase and of the same amplitude. Usually, each of the integrators comprises a high-gain operational amplifier having an input resistor and a feedback capacitor.

However, there is no means provided in such a system for stabilizing the amplitude of oscillation and therefore the amplitude will either increase or diminish with time. Stabilization can be achieved by providing a small amount of positive feedback in the loop together with a limiter to keep the amplitude of oscillation from exceeding a predetermined limit. This kind of control, while achieving stabilization, introduces some harmonic distortion because it tends to flatten the tops of the sine waves.

Harmonic distortion can be avoided by using a combination of negative feedback and self-regulated positive feedback. Negative feedback may be obtained by coupling a resistor $R_N$ in parallel with the feedback capacitor of the second integrator, and positive feedback by providing the second integrator with an additional input resistor $R_P$ coupled to the output of the inverting amplifier. Negative feedback through $R_N$ damps the oscillation and positive feedback through $R_P$ has the opposite effect. When $R_N=R_P$, the amplitude of the oscillation remains constant.

In such a circuit, either $R_N$ or $R_P$ may be a temperature-sensitive resistor. Most commonly, $R_P$ is the filament of an incandescent lamp having a resistance at some desired voltage which is equal to $R_N$. The cold resistance $R_P$ is less than $R_N$ and, when the filament is cold, the positive feedback in the circuit exceeds the negative feedback, causing the amplitude of the oscillating voltage to increase. As the voltage builds up, the lamp filament increases in temperature and the resistance $R_P$ of its filament quickly increases until $R_P = R_N$. Any subsequent change in amplitude changes the temperature of the filament. An increase in amplitude causes $R_P$ to exceed $R_N$, making the positive feedback inferior to the negative feedback, so that the amplitude will decrease. A decrease in amplitude causes $R_P$ to become less than $R_N$, making the positive feedback superior to the negative feedback, so that the amplitude will increase.

This prior art circuit achieves excellent amplitude control without harmonic distortion. It also provides two oscillating voltages in precise phase quadrature. But the two voltages will have the same amplitude only if the time constants of the two integrators are exactly the same. Any differential change in the values of input resistance or feedback capacitance, as from the effects of aging or of changes in environmental temperature, will disturb the amplitude of one voltage relative to the amplitude of the other.

An object of my invention is to provide a two-phase electronic oscillator wherein the output voltages are precise sinusoids with little or no harmonic distortion, precisely 90° out-of-phase and matched in amplitude, and in which the amplitude match between the output voltages is maintained without having to trim or otherwise alter the impedances in the oscillator circuit. This is achieved by replacing the second integrator of the prior art circuit with an all-pass network.

SUMMARY OF THE INVENTION

In accordance with the invention, a two-phase electronic oscillator is provided which comprises an integrator and an all-pass network, the output terminal of the integrator being coupled to the input terminal of the all-pass network and the output terminal of the all-pass network being coupled to the input terminal of the integrator.

In general, a closed-loop oscillator maintains a steady sinusoidal oscillation at that frequency for which the gain around the loop is exactly unity.

The gain $A_1$ of the integrator may be expressed as $-(f_1/jf)$, where $2\pi/f_1$ is the time constant of the integrator. The magnitude $|A_1|$ of the gain is inversely proportional to frequency; and the phase shift $\theta_1$ between the voltages at the input and output terminals of the integrator is 90° for all frequencies. In particular, for the frequency $f=f_1 \; |A_1| = 1$.

The gain $A_2$ of the all-pass network is $(f_2-jf)/(f_2+jf)$, where $2\pi/f_2$ is the time constant of the network. Such networks are well known and do not per se form a part of my invention. The magnitude $|A_2|$ of the gain is equal to unity for all frequencies; and the phase shift $\theta_2$ between the voltages at the input and output terminals of the all-pass network is such that tan $$\tan\frac{\theta}{2} = -\frac{f}{f_2}$$

In particular, for the frequency $f=f_2$, $\theta_2 = -90°$.

For $f=f_1$ the magnitude of the gain around the loop is unity, and for $f=f_2$ the phase-shift around the loop is zero. Therefore, if $f_1=f_2$ the system will oscillate at the frequency $f=f_1=f_2$. Further, if $f_1<f_2$ the system is simply stable (i.e. all oscillations are damped), and the outputs of the integrator and of the all-pass network tend toward zero. If $f_1>f_2$ the system is unstable.

Also in accordance with the invention, means are provided for adjusting the time constant of either the integrator or of the all-pass network as a function of the amplitude of the oscillating voltages generated by the oscillator, in order to enforce the equality $f_1=f_2$. This means can comprise an input resistor in the integrator which has a positive temperature coefficient of resistance, or a resistor in the all-pass network which has a negative temperature coefficient of resistance.

DESCRIPTION OF THE PREFERRED EMBODIMENTS

Figures 1, 1A, 1B:
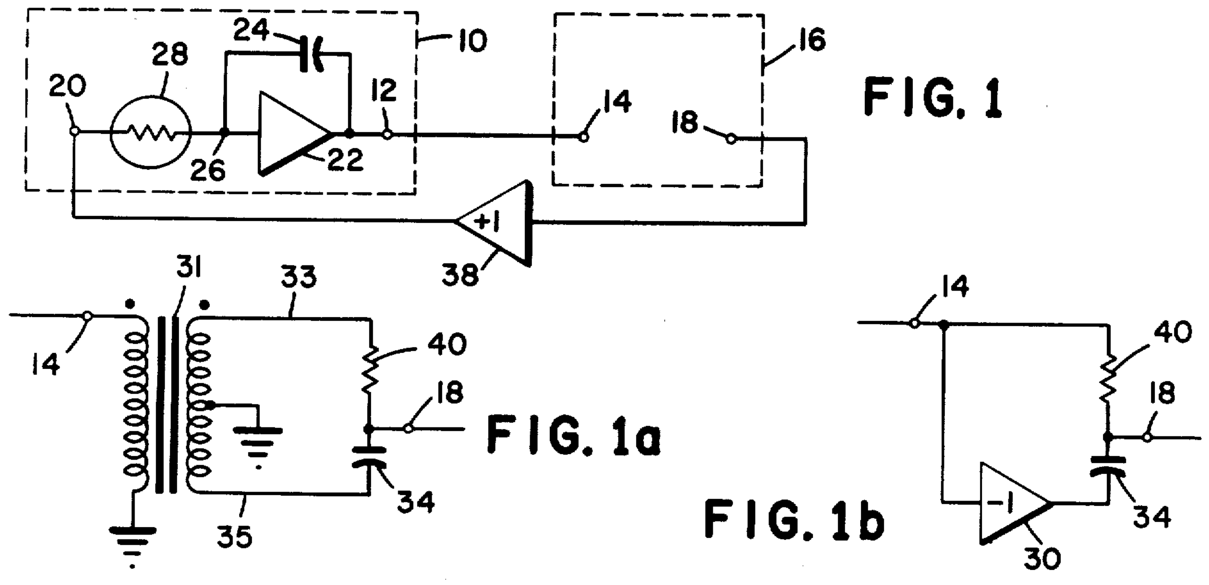
FIG. 1 is a schematic diagram of a first embodiment of the invention wherein the time constant of the integrator is adjusted by means of an input resistor having a positive temperature coefficient of resistance.
FIG. 1*a* is a schematic diagram of a first realization of an all-pass network.
FIG. 1*b* is a schematic diagram of a second realization of an all-pass network.

Referring to FIG. 1, the electronic oscillator comprises an integrator 10 having an output terminal 12 coupled to the input terminal 14 of an all-pass network 16. The output terminal 18 of all-pass network 16 is coupled by a unity gain amplifier 38 to an input terminal 20 of integrator 10. Integrator 10 comprises a high-gain operational amplifier 22 having a capacitor 24 coupled between its input 26 and output terminal 12, and the filament of an incandescent lamp 28 connected between input terminal 20 and the input 26 of amplifier 22. The filament of incandescent lamp 28 has a positive temperature resistance characteristic such that its resistance increases markedly as the voltage applied across it increases.

The gain of integrator 10 is given by the expression $-(f_1/jf)$, where $$2\pi f_1 = \frac{1}{R_{28}\, C_{24}}$$

$R_{28}$ being the resistance of incandescent lamp filament 28 and $C_{24}$ being the capacitance of capacitor 24. The phase difference $\theta_1$ between the voltages at output terminal 12 and input terminal 20 has a constant value of 90° for all frequencies within the operating range of the system, and the magnitude $|A_1|$ of the gain is inversely proportional to frequency. At $f=f_1$, the magnitude of the gain is unity.

Referring to FIG. 1*a*, the all-pass network 16 of FIG. 1 may comprise a transformer 31 having a center tapped secondary winding coupled to an R-C network. If the secondary winding has twice as many turns as the primary winding, then the voltage appearing at the one end 33 of the secondary winding will have the same magnitude and polarity as the voltage at the input terminal 14, while the voltage appearing at the other end 35 will have the same magnitude but opposite polarity. A resistor 40 is coupled between the end 33 and output terminal 18, and a capacitor 34 is coupled between the end 35 and output terminal 18.

The gain from the input terminal 14 to the output terminal 18 is given by the expression $(f_2-jf)/(f_2+jf)$, where $$2\pi f_2 = \frac{1}{R_{40}\, C_{34}}$$

R40 being the resistance of resistor 40 and $C_{34}$ being the capacitance of capacitor 34. The phase difference $\theta_2$ between the voltage at output terminal 18 and input terminal 14 varies from 0° at low frequencies to −180° at high frequencies. At $f=f_2$, the phase shift is −90°.

A second realization of the all-pass network 16 of FIG. 1 is shown in FIG. 1*b*. The resistor 40 couples the input terminal 14 to the output terminal 18. An inverting amplifier 30 has its input coupled to the input terminal 14. The capacitor 34 couples the output of inverting amplifier 30 to the output terminal 18.

Inasmuch as the voltages applied to resistor 40 and capacitor 34 are the same in FIG. 1*b* as in FIG. 1*a*, the gain from the input terminal 14 to the output terminal 18 is the same in FIG. 1*b* as in FIG. 1*a*.

Since the magnitude of the gain of all-pass network 16 is unity for all frequencies and the magnitude of the gain of integrator 10 is unity when $f=f_1$, the magnitude of the gain around the entire loop consisting of integrator 10, all-pass network 16 and amplifier 38 is unity at $f=f_1$. Similarly, since the phase shift of integrator 10 is +90° for all frequencies and the phase shift of all-pass network 16 is −90° when $f=f_2$, the phase shift around the loop is zero at $f=f_2$. Consequently, if $f_1=f_2$, the system oscillates at the pure sinusoidal frequency $f=f_1=f_2$; the voltage at output terminal 12 of integrator 10 is in precise quadrature with the voltage at input terminal 20, and the two voltages have precisely the same amplitude.

When power is first applied to the oscillator, the filament of lamp 28 is cold, the resistance $R_{28}$ is relatively low and $f_1$ is greater than $f_2$. Under this condition the system is unstable and the magnitude of the voltage at terminal 20 quickly rises, heating lamp filament 28 and causing its resistance to increase. Consequently, the time constant $R_{28}\, C_{24}$ increases and $f_1$ decreases until it is equal to $f_2$, which is the condition for undamped oscillation. Any further increase of the time constant $R_{28}\, C_{24}$ would make $f_1$ less than $f_2$, thereby damping the oscillation. That would permit the lamp filament to cool, reducing its resistance and reestablishing the equality $f_1=f_2$.

The frequency of the oscillation is determined exclusively by the resistance $R_{40}$ and the capacitance $C_{34}$, because they establish the value of $f_2$. The capacitance $C_{24}$ does not affect the frequency because the incandescent lamp 28, by adjusting the resistance $R_{28}$, adjusts the time constant $R_{28}\, C_{24}$ to make $f_1=f_2$. If $R_{40}$ or $C_{34}$ in the all-pass network should change for any reason, the natural frequency of the system would change accordingly, but the voltages at the input and output terminals of integrator 10 would remain in quadrature and matched in amplitude. Also, any disturbance within the system that elicits an adjustment of $R_{28}$ necessarily entails at least a small change in the amplitude of oscillation, but in the respect that voltages at terminals 20 and 12 are affected equally.

Figure 2:
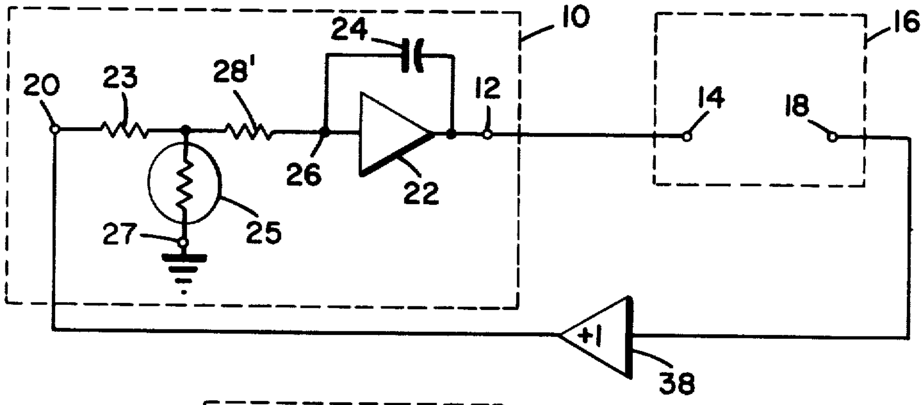
FIG. 2 is a schematic diagram of a second embodiment of the invention wherein the time constant of the integrator is adjusted by means of a voltage divider which includes a resistor having a negative temperature coefficient of resistance.

A second embodiment of the invention is shown in FIG. 2 wherein components corresponding to those of FIG. 1 have been designated by identical numbers. The high-gain operational amplifier 22 has an ordinary input resistor 28' instead of the incandescent lamp 28, and the adjustment of the time constant of integrator 10 as a function of the amplitude of oscillation is accomplished by a voltage divider comprising resistor 23 and thermistor 25 coupled between input terminal 20 and a grounded reference terminal 27.

The thermistor 25 is a resistive device having a large negative temperature coefficient of resistance. As the magnitude of the voltage at the input terminal 20 of integrator 10 increases, the current through thermistor 25 increases, causing the temperature to increase and the resistance to decrease. Consequently, the ratio of current in the input resistor 28' to voltage at the input terminal 20 decreases, which effect is identical to the effect produced by an increase in temperature of the resistor 28 in FIG. 1. Therefore, the system of FIG. 2 behaves like the system of FIG. 1 and produces the same two oscillating voltages at terminals 20 and 12.

Figure 3:
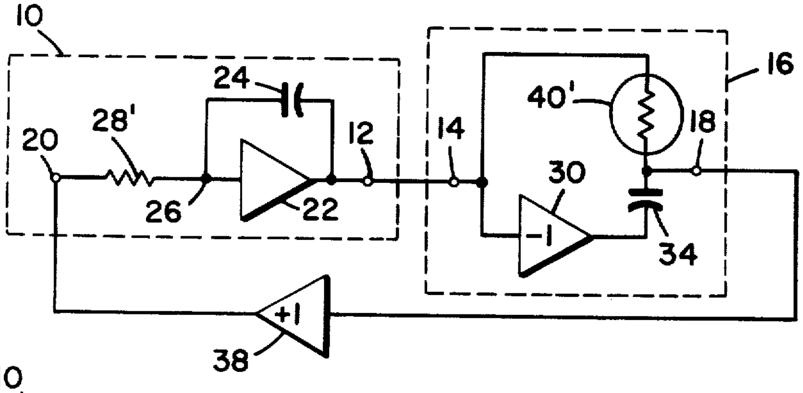
FIG. 3 is a schematic diagram of a third embodiment of the invention wherein the time constant of the all-pass network is adjusted by means of a resistor having a negative temperature coefficient of resistance.

A third embodiment of the invention is shown in FIG. 3. The integrator 10 comprises a high-gain operational amplifier 22 having a feedback capacitor 24 and an ordinary input resistor 28'. The all-pass network 16 is the same as in FIG. 1*a* (or FIG. 1*b*) except that the resistor 40 has been replaced by the thermistor 40' having a negative temperature coefficient of resistance.

As before, the gain of the integrator 10 is $-(f_1/jf)$, where $$2\pi f_1 = \frac{1}{R_{28}\,C_{24}},$$

$R_{28}$ being the resistance of resistor 28' and $C_{24}$ being the capacitance of capacitor 24; and the gain of the all-pass network 16 is $(f_2-jf)/(f_2+jf)$, where $$2\pi f_2 = \frac{1}{R_{40}\,C_{34}},$$

$R_{40}$ being the resistance of thermistor 40' and $C_{34}$ being the capacitance of capacitor 34.

When power is first applied to the oscillator of FIG. 3, the thermistor 40' is cold, the resistance $R_{40}$ is relatively high and $f_2$ is less than $f_1$. Under this condition the system is unstable and the magnitude of the voltage at terminal 14 rises, heating thermistor 40' and causing its resistance to decrease. Consequently, the time constant $R_{40}\,C_{34}$ decreases and $f_2$ increases until it is equal to $f_1$, which is the condition for undamped oscillation. The frequency of the oscillation is determined exclusively by the resistance $R_{28}$ and the capacitance $C_{24}$, because they establish the value of $f_1$.

The amplifier 38, which couples the output of the all-pass network 16 to the input of the integrator 10 in all three embodiments of the invention, is provided as a buffer to isolate the source impedance at terminal 18 from the input impedance at terminal 20. It also provides a low impedance source for one of the two useful output voltages of the oscillator; namely, the voltage appearing at terminal 20. The other useful output voltage, appearing at terminal 12, has a low impedance source because it is the output of the amplifier 22.

Figure 4:
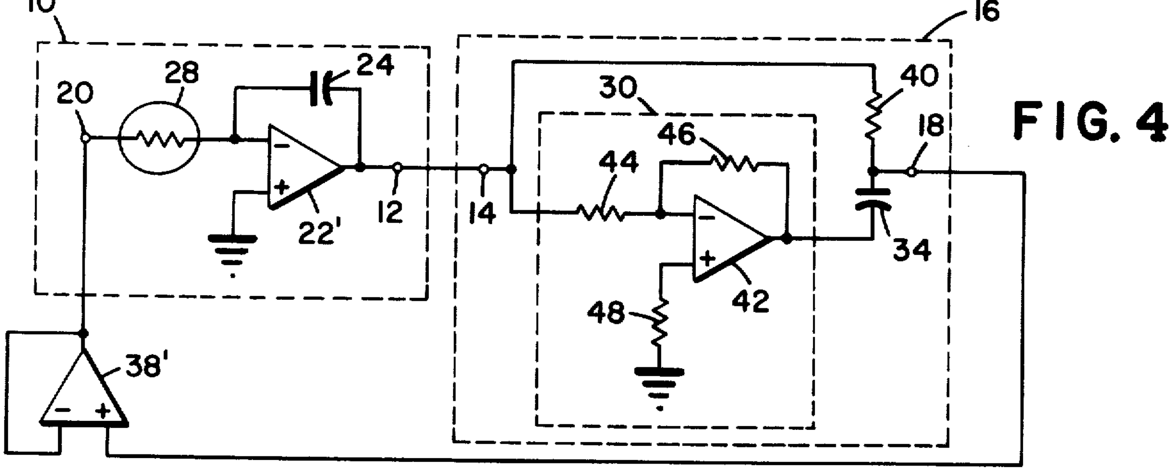
FIG. 4 is a schematic diagram showing additional circuit components of the embodiment of FIG. 1, using the all-pass network of FIG. 1*b*.

A practical circuit diagram for a precision two-phase oscillator in accordance with the invention is shown in FIG. 4. The circuit is similar to that of FIG. 1 with the all-pass network of FIG. 1*b*, except that commercially available operational amplifiers 22' and 38' are shown in place of amplifiers 22 and 38, and additional details of inverting amplifier 30 have been included. As shown, amplifier 22' has a (−) input connected to the junction of incandescent lamp 28 and capacitor 24, and has a grounded (+) input. The buffer amplifier 38' has a (−) input connected directly to its own output, and a (+) input connected to the output terminal 18 of the all-pass network 16.

Inverting amplifier 30 comprises an operational amplifier 42 having a (−) and a (+) input. The (−) input is connected by a resistor 44 to terminal 14 and by a resistor 46 to the output of the amplifier 42. A resistor 48 grounds the (+) input.

In a typical 400 Hz oscillator constructed in accordance with FIG. 4, the operational amplifiers 22', 38' and 42 are a type LM741 or equivalent, sold by National Semiconductor Company. Incandescent lamp 28 is a No. 327, sold by Chicago Miniature Lamp Works. Capacitor 24 is a polystyrene and has a value of 0.47 microfarad, capacitor 34 is an NPO Ceramic with a value of 0.01 microfarad, resistor 40 has a resistance of 40,200 ohms, resistors 44 and 46 are matched to 0.01% and have values of 10,000 ohms each, and resistor 48 has a value of 5100 ohms.

In the second and third embodiments (FIGS. 2 and 3), the thermistor 25 or 40' may be a type BA44V3, sold by Fenwal Electronics, Inc.

All of the above components are commercially available, making it possible to obtain cheaply an excellent two-phase oscillator. Measurements made on the system of FIG. 4 indicate that the output voltages at terminals 20 and 12 differ from perfect quadrature by less than 0.1°, and that the amplitude match is better than 0.1%. When the fundamental oscillation is 400 Hz, the harmonic distortion measured by a Hewlett-Packard 331A Distortion Analyzer is 0.02%.

While specific types of integrator and all-pass network have been illustrated, it shall be understood that the invention will operate with any type of integrator or all-pass network having the described characteristics, and is not limited to those shown herein.

What is claimed is:

1. An electronic oscillator comprising an integrator having input and output terminals; and an all-pass network having an input terminal coupled to the output terminal of said integrator and an output terminal coupled to the input terminal of said integrator, said all-pass network including means for adjusting the time constant thereof as a function of the amplitude of an oscillating voltage generated by said oscillator, said oscillator generating voltages at said input and output terminals of said integrator which are in precise phase quadrature and precisely matched in amplitude.

2. An electronic oscillator comprising an integrator and an all-pass network as defined by claim 1 wherein said all-pass network comprises a voltage inverter having an input coupled to the input terminal of said all-pass network; a capacitor coupled between the output of said voltage inverter and the output terminal of said all-pass network; and a variable resistive means coupled between the input and output terminals of said all-pass network, said variable resistive means adjusting the time constant of said all-pass network.

3. An electronic oscillator as defined by claim 2 wherein said resistive means comprises a resistor having a negative temperature coefficient of resistance.

4. An electronic oscillator as defined by claim 2 wherein said integrator comprises an amplifier having an output coupled to the output terminal of said integrator; a capacitor coupled between the input and output of said amplifier; and a resistive means coupled between the input terminal of said integrator and the input of said amplifier, said resistive means of said integrator determining the frequency of the voltages generated by said oscillator.

* * * * *